(12) United States Patent
Kuriki et al.

(10) Patent No.: US 11,587,959 B2
(45) Date of Patent: Feb. 21, 2023

(54) POWER STORAGE ELEMENT, MANUFACTURING METHOD THEREOF, AND POWER STORAGE DEVICE

(71) Applicant: Semiconductor Energy Laboratory Co., Ltd., Atsugi (JP)

(72) Inventors: Kazutaka Kuriki, Kanagawa (JP); Ryota Tajima, Kanagawa (JP); Tamae Moriwaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/329,266

(22) Filed: May 25, 2021

(65) Prior Publication Data

US 2021/0280616 A1 Sep. 9, 2021

Related U.S. Application Data

(63) Continuation of application No. 16/558,396, filed on Sep. 3, 2019, now Pat. No. 11,056,516, which is a
(Continued)

(30) Foreign Application Priority Data

Mar. 26, 2012 (JP) ................................ 2012-069536

(51) Int. Cl.
*H01M 10/0565* (2010.01)
*H01M 10/052* (2010.01)
(Continued)

(52) U.S. Cl.
CPC ............. *H01L 27/13* (2013.01); *H01G 11/08* (2013.01); *H01G 11/46* (2013.01); *H01G 11/56* (2013.01);
(Continued)

(58) Field of Classification Search
CPC H01G 11/46; H01M 10/052; H01M 10/0562; H01M 10/0565
See application file for complete search history.

(56) References Cited

U.S. PATENT DOCUMENTS

| 4,328,456 A | 5/1982 | Suzuki et al. |
| 4,916,035 A | 4/1990 | Yamashita et al. |

(Continued)

FOREIGN PATENT DOCUMENTS

| CN | 001409455 A | 4/2003 |
| JP | 05-236608 A | 9/1993 |

(Continued)

*Primary Examiner* — Stewart A Fraser
(74) *Attorney, Agent, or Firm* — Fish & Richardson P.C.

(57) ABSTRACT

Disclosed is a power storage element including a positive electrode current collector layer and a negative electrode current collector layer which are arranged on the same plane and can be formed through a simple process. The power storage element further includes a positive electrode active material layer on the positive electrode current collector layer; a negative electrode active material layer on the negative electrode current collector layer; and a solid electrolyte layer in contact with at least the positive electrode active material layer and the negative electrode active material layer. The positive electrode active material layer and the negative electrode active material layer are formed by oxidation treatment.

18 Claims, 10 Drawing Sheets

Related U.S. Application Data continuation of application No. 15/677,097, filed on Aug. 15, 2017, now Pat. No. 10,461,103, which is a continuation of application No. 15/364,591, filed on Nov. 30, 2016, now Pat. No. 9,748,287, which is a continuation of application No. 14/744,151, filed on Jun. 19, 2015, now Pat. No. 9,660,298, which is a continuation of application No. 13/797,104, filed on Mar. 12, 2013, now Pat. No. 9,070,950.

(51) Int. Cl.

| | | |
|---|---|---|
| H01M 10/0562 | (2010.01) | |
| H01M 10/0585 | (2010.01) | |
| H01L 27/13 | (2006.01) | |
| H01G 11/46 | (2013.01) | |
| H01G 11/56 | (2013.01) | |
| H01G 11/08 | (2013.01) | |
| H01G 11/84 | (2013.01) | |
| H01L 27/12 | (2006.01) | |
| H01L 29/24 | (2006.01) | |
| H01L 29/66 | (2006.01) | |
| H01L 29/786 | (2006.01) | |

(52) U.S. Cl.
CPC .......... *H01G 11/84* (2013.01); *H01L 27/124* (2013.01); *H01L 27/1225* (2013.01); *H01L 27/1248* (2013.01); *H01L 27/1255* (2013.01); *H01L 27/1259* (2013.01); *H01L 29/24* (2013.01); *H01L 29/66969* (2013.01); *H01L 29/7869* (2013.01); *H01M 10/052* (2013.01); *H01M 10/0562* (2013.01); *H01M 10/0565* (2013.01); *H01M 10/0585* (2013.01); *H01M 2300/0065* (2013.01); *H01M 2300/0071* (2013.01); *H01M 2300/0082* (2013.01); *Y02E 60/10* (2013.01); *Y02E 60/13* (2013.01); *Y02P 70/50* (2015.11); *Y10T 29/49115* (2015.01)

(56) References Cited

U.S. PATENT DOCUMENTS

| | | | |
|---|---|---|---|
| 6,034,506 | A | 3/2000 | Hall |
| 6,297,618 | B2 | 10/2001 | Emori et al. |
| 6,379,835 | B1 | 4/2002 | Kucherovsky et al. |
| 6,828,757 | B2 | 12/2004 | Furukawa |
| 7,151,378 | B2 | 12/2006 | Valenta, Jr. et al. |
| 7,471,068 | B2 | 12/2008 | Cegnar |
| 7,999,511 | B2 | 8/2011 | Umetsu |
| 8,103,401 | B2 | 1/2012 | Kubo et al. |
| 8,581,557 | B2 | 11/2013 | Kanoh et al. |
| 8,754,654 | B2 | 6/2014 | Furukawa |
| 8,760,903 | B2 | 6/2014 | Fujita |
| 8,878,492 | B2 | 11/2014 | Furukawa et al. |
| 9,203,478 | B2 | 12/2015 | Saito |
| 9,401,525 | B2 | 7/2016 | Izumi |
| 2001/0005125 | A1 | 6/2001 | Nagai et al. |
| 2004/0058237 | A1* | 3/2004 | Higuchi .......... C23C 14/30 429/162 |
| 2004/0126635 | A1 | 7/2004 | Pearson |
| 2006/0092583 | A1 | 5/2006 | Alahmad et al. |
| 2006/0121342 | A1 | 6/2006 | Sano et al. |
| 2007/0037059 | A1 | 2/2007 | Salot et al. |
| 2007/0259271 | A1 | 11/2007 | Nanno et al. |
| 2008/0158217 | A1 | 7/2008 | Hata et al. |
| 2008/0252254 | A1 | 10/2008 | Osada |
| 2010/0209771 | A1 | 8/2010 | Shizuka et al. |
| 2010/0239907 | A1 | 9/2010 | Izumi |
| 2010/0261048 | A1 | 10/2010 | Kim et al. |
| 2011/0073991 | A1 | 3/2011 | Kuriki et al. |
| 2011/0075322 | A1 | 3/2011 | Kuriki et al. |
| 2011/0287296 | A1 | 11/2011 | Sabi et al. |
| 2012/0133310 | A1 | 5/2012 | Lee |
| 2012/0161709 | A1 | 6/2012 | Fujii et al. |
| 2012/0274140 | A1 | 11/2012 | Ganor |
| 2012/0286578 | A1 | 11/2012 | Uno et al. |
| 2012/0313439 | A1 | 12/2012 | Yamaguchi et al. |
| 2013/0249054 | A1 | 9/2013 | Kuriki et al. |
| 2013/0261043 | A1 | 10/2013 | Bello et al. |
| 2016/0329604 | A1 | 11/2016 | Izumi |

FOREIGN PATENT DOCUMENTS

| | | |
|---|---|---|
| JP | 08-340641 A | 12/1996 |
| JP | 10-284130 A | 10/1998 |
| JP | 2001-119813 A | 4/2001 |
| JP | 2001-258166 A | 9/2001 |
| JP | 2001-309563 A | 11/2001 |
| JP | 2002-171675 A | 6/2002 |
| JP | 2004-023993 A | 1/2004 |
| JP | 2004-039549 A | 2/2004 |
| JP | 2004-127743 A | 4/2004 |
| JP | 2006-147210 A | 6/2006 |
| JP | 2006-172915 A | 6/2006 |
| JP | 2006-197676 A | 7/2006 |
| JP | 2007-005279 A | 1/2007 |
| JP | 2007-508671 | 4/2007 |
| JP | 2007-123081 A | 5/2007 |
| JP | 2008-043009 A | 2/2008 |
| JP | 2008-148387 A | 6/2008 |
| JP | 2008-171599 A | 7/2008 |
| JP | 2008-171733 A | 7/2008 |
| JP | 2008-176962 A | 7/2008 |
| JP | 2008-278635 A | 11/2008 |
| JP | 2009-032429 A | 2/2009 |
| JP | 2010-055811 A | 3/2010 |
| JP | 2010-182447 A | 8/2010 |
| JP | 2010-245031 A | 10/2010 |
| JP | 2011-109875 A | 6/2011 |
| JP | 2011-205872 A | 10/2011 |

* cited by examiner

POWER STORAGE ELEMENT, MANUFACTURING METHOD THEREOF, AND POWER STORAGE DEVICE

CROSS-REFERENCE TO RELATED APPLICATIONS

This application is a continuation of U.S. application Ser. No. 16/558,396, filed Sep. 3, 2019, now allowed, which is a continuation of U.S. application Ser. No. 15/677,097, filed Aug. 15, 2017, now U.S. Pat. No. 10,461,103, which is a continuation of U.S. application Ser. No. 15/364,591, filed Nov. 30, 2016, now U.S. Pat. No. 9,748,287, which is a continuation of U.S. application Ser. No. 14/744,151, filed Jun. 19, 2015, now U.S. Pat. No. 9,660,298, which is a continuation of U.S. application Ser. No. 13/797,104, filed Mar. 12, 2013, now U.S. Pat. No. 9,070,950, which claims the benefit of a foreign priority application filed in Japan as Serial No. 2012-069536 on Mar. 26, 2012, all of which are incorporated by reference.

BACKGROUND OF THE INVENTION

1. Field of the Invention

The present invention relates to a power storage element, a manufacturing method of the power storage element, and a power storage device.

A power storage element in this specification refers to any element which has a function of storing power, and a power storage device in this specification refers to any device which has a function of storing power and in which a plurality of power storage elements are arranged in a plane.

2. Description of the Related Art

In recent years, a variety of power storage devices such as lithium secondary batteries, lithium-ion capacitors, and air cells have been developed. In particular, a lithium secondary battery in which charge and discharge are performed by transfer of lithium ions between a positive electrode and a negative electrode has been attracting attention as a secondary battery with high output and high energy density.

A lithium secondary battery refers to a secondary battery where lithium ions are used as carrier ions. Examples of carrier ions which can be used instead of lithium ions include alkali-metal ions such as sodium ions and potassium ions; alkaline-earth metal ions such as calcium ions, strontium ions, and barium ions; beryllium ions; and magnesium ions.

Many of conventional electrolytes of lithium secondary batteries are liquid electrolytes which have high lithium conductivity at room temperature, and organic electrolytic solutions are used in many of commercially available lithium secondary batteries. However, lithium secondary batteries which contain organic electrolytic solutions have risks of leaking the electrolytic solutions and catching fire; therefore, an all-solid-state battery which contains a solid electrolyte and has a high level of safety has been actively researched (see Patent Document 1).

Further, a secondary battery where a positive electrode and a negative electrode are formed over one of surfaces of a substrate and a solid electrolyte is provided between the positive electrode and the negative electrode has been developed (see Patent Document 2).

REFERENCE

[Patent Document 1] Japanese Published Patent Application No. 2007-123081

[Patent Document 2] Japanese Published Patent Application No. 2006-147210

SUMMARY OF THE INVENTION

In the above secondary battery where a positive electrode and a negative electrode are formed over one of surfaces of a substrate and a solid electrolyte is provided between the positive electrode and the negative electrode, a physical short circuit between the positive electrode and the negative electrode is minimized and a separator is unnecessary. For this reason, the battery can be manufactured at low cost. However, layers (e.g., a positive electrode current collector layer, a positive electrode active material layer, a negative electrode current collector layer, a negative electrode active material layer, and a solid electrolyte layer) included in the battery are stacked in order; thus, the number of steps is large, leading to a long manufacturing process. Accordingly, the manufacturing cost increases.

In view of the above, an object of one embodiment of the present invention is to provide a power storage element which includes a positive electrode and a negative electrode provided so as to be level with each other (that is, arranged in the same plane) and which can be formed through a simple process, a formation method of the power storage element, and a power storage device where a plurality of the power storage elements are arranged so as to be level with each other.

One embodiment of the present invention is a power storage element including a positive electrode current collector layer and a negative electrode current collector layer which are level with each other; a positive electrode active material layer on the positive electrode current collector layer; a negative electrode active material layer on the negative electrode current collector layer; and a solid electrolyte layer in contact with at least the positive electrode active material layer and the negative electrode active material layer. The positive electrode active material layer contains a metal oxide containing a metal element which is contained in the positive electrode current collector layer. The negative electrode active material layer contains a metal oxide containing a metal element which is contained in the negative electrode current collector layer.

Further, the power storage element may include a lithium layer which overlaps with at least one of the positive electrode active material layer and the negative electrode active material layer.

One embodiment of the present invention is a power storage device where a plurality of the power storage elements are arranged so as to be level with each other. The plurality of power storage elements are electrically connected to each other through a wiring, thereby being connected in series or in parallel in the power storage device.

One embodiment of the present invention may be provided with a means for switching between series connection and parallel connection of the power storage elements. As the switching means, for example, a transistor may be used.

One embodiment of the present invention is an electrical device including the above power storage element and the above power storage device.

One embodiment of the present invention is a manufacturing method of a power storage element. The method includes the steps of forming a positive electrode current collector layer and a negative electrode current collector layer so that they are level with each other; performing oxidation treatment on the positive electrode current collector layer and the negative electrode current collector layer to form a positive electrode active material layer on a surface of the positive electrode current collector layer and a negative electrode active material layer on a surface of the negative electrode current collector layer; forming a solid electrolyte layer in contact with at least the positive electrode active material layer and the negative electrode active material layer; and forming a lithium layer overlapping with at least one of the positive electrode active material layer and the negative electrode active material layer. The positive electrode active material layer contains a metal oxide containing a metal element which is contained in the positive electrode current collector layer. The negative electrode active material layer contains a metal oxide containing a metal element which is contained in the negative electrode current collector layer.

The oxidation treatment for the positive electrode current collector layer and the negative electrode current collector layer can be performed by oxygen plasma treatment. For an oxygen atmosphere of the oxygen plasma treatment, an oxygen gas, a dinitrogen monoxide gas, an ozone gas, or the like may be used. An oxidation treatment apparatus is not particularly limited as long as it is provided with a plasma generation mechanism; for example, a plasma CVD apparatus or a sputtering apparatus can be used.

Alternatively, anodic oxidation treatment may be performed for oxidation treatment. Still alternatively, heat treatment in an oxygen atmosphere may be performed. For the oxygen atmosphere, any of the above gases which can be used for the oxygen plasma treatment can be used.

As the positive electrode active material layer, a layer which contains vanadium oxide or manganese oxide may be used.

As the negative electrode active material layer, a layer which contains niobium oxide, copper oxide, cobalt oxide, nickel oxide, iron oxide, tungsten oxide, molybdenum oxide, or tantalum oxide may be used.

In one embodiment of the present invention, as the solid electrolyte layer in the power storage element or the power storage device, a layer which contains a compound containing lithium and sulfur, a compound containing lithium and oxygen, or lithium oxide may be used.

Thus, according to the present invention, the oxygen treatment performed on the positive electrode current collector layer and the negative electrode current collector layer enables formation of the positive electrode active material layer and the negative electrode active material layer on the surface of the positive electrode current collector layer and the surface of the negative electrode current collector layer, respectively. Accordingly, the manufacturing process can be simplified, leading to a reduction in manufacturing cost.

According to one embodiment of the present invention, a power storage element including a positive electrode and a negative electrode provided so as to be level with each other and which can be formed through a simple process, a manufacturing method of the power storage element, and a power storage device.

DETAILED DESCRIPTION OF THE INVENTION

Figure 1A:
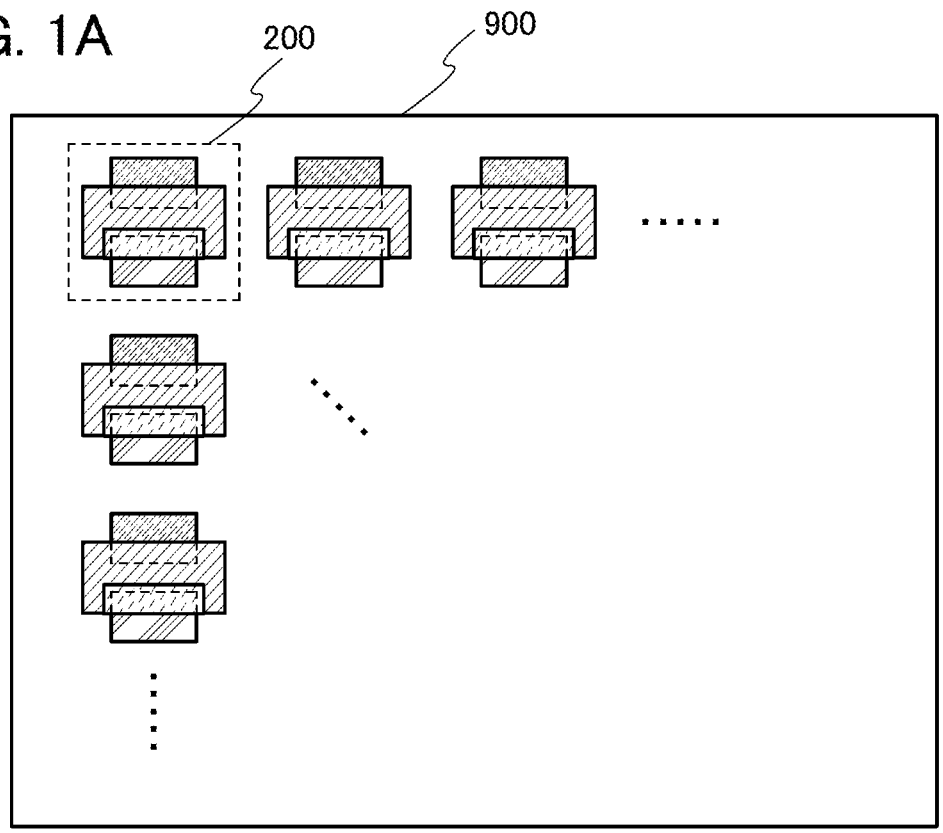
FIGS. 1A to 1C are top views and a cross-sectional view which illustrate a power storage device of one embodiment of the present invention.

Embodiments of the present invention will be described with reference to the drawings. Note that the present invention is not limited to the following description and it will be readily appreciated by those skilled in the art that modes and details can be modified in various ways without departing from the spirit and scope of the present invention. Therefore, the present invention should not be construed as being limited to the description in the embodiments. In description using the drawings for reference, in some cases, common reference numerals are used for the same portions in different drawings. Further, in some cases, the same hatching patterns are applied to similar portions, and the similar portions are not necessarily designated by reference numerals.

Note that in each drawing described in this specification, the size, the layer thickness, or the region of each component is exaggerated for clarity in some cases. Therefore, embodiments of the present invention are not limited to such scales.

Embodiment 1

In this embodiment, a power storage element, a formation method thereof, and a power storage device of one embodiment of the present invention will be described with reference to FIGS. 1A to 1C and FIGS. 2A to 2D.

Figure 1B:
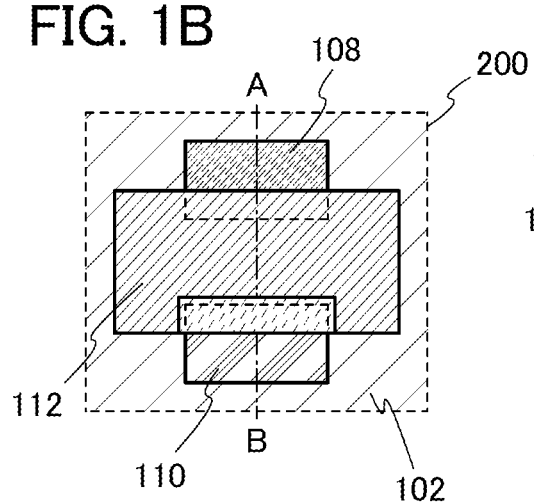
Figure 1C:
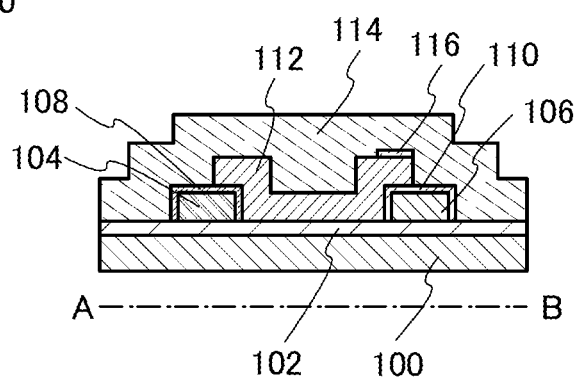

FIGS. 1A to 1C illustrate a power storage element and a power storage device in this embodiment. FIG 1A is a top view of a power storage device 900 in this embodiment which shows the case where power storage elements 200 are arranged so as to be level with each other. FIG. 1B is a top view of the power storage element 200, and FIG. 1C is a cross-sectional view along dashed dotted line A-B in FIG. 1B. Note that in FIG. 1B, a sealing layer 114 and the like are omitted for simplicity.

Further, in this embodiment, a power storage element will be described in which a vanadium layer is used as a positive electrode current collector layer; a vanadium oxide layer is used as a positive electrode active material layer; a niobium layer is used as a negative electrode current collector layer; and a niobium oxide layer is used as a negative electrode active material layer.

Note that for convenience, a power storage device in this specification refers to the structure where a plurality of power storage elements are arranged so as to be level with each other. Although FIG. 1A illustrates the case where the power storage elements 200 are arranged in a matrix, one embodiment of the present invention is not limited thereto. Random arrangement may be employed and the positions of opposing positive and negative electrodes may be changed as appropriate. Although not illustrated, a wiring, a terminal, or the like connected to each power storage element 200 may be provided.

The power storage element 200 in FIG. 1C includes a substrate 100, an insulating layer 102 over the substrate 100, a vanadium layer 104 and a niobium layer 106 which are level with each other and are over the insulating layer 102, a vanadium oxide layer 108 over the vanadium layer 104, a niobium oxide layer 110 over the niobium layer 106, and a solid electrolyte layer 112 in contact with at least the vanadium oxide layer 108 and the niobium oxide layer 110. The vanadium layer 104 and the vanadium oxide layer 108 function as a positive electrode, and the niobium layer 106 and the niobium oxide layer 110 function as a negative electrode. Further, a sealing layer 114 is preferably formed over the vanadium oxide layer 108, the niobium oxide layer 110, the solid electrolyte layer 112, and the insulating layer 102.

In FIG. 1C, a lithium layer 116 which overlaps with the niobium oxide layer 110 is formed over the solid electrolyte layer 112. This lithium layer is for supplying lithium serving as a carrier to the niobium oxide layer 110 serving as a negative electrode active material in the power storage element 200 (for predoping the niobium oxide layer 110 with lithium). Although predoping the niobium oxide layer 110 with lithium is described above, the vanadium oxide layer 108 may alternatively be predoped with lithium. The lithium layer 116 is formed so as to overlap with at least one of the vanadium oxide layer 108 and the niobium oxide layer 110 and may be formed over the entire surface over which the lithium layer 116 is to be formed. Further, a copper layer or a nickel layer may be formed in contact with the lithium layer 116 (not particularly illustrated). The copper layer or the nickel layer has a shape substantially the same as that of the lithium layer 116. The copper layer or the nickel layer can function as a current collector when the niobium oxide layer 110 is predoped with lithium from the lithium layer 116.

The lithium layer 116 is formed so as to overlap with the niobium oxide layer 110 in this manner and discharging is performed with the niobium layer 106 and the niobium oxide layer 110 serving as a positive electrode and the lithium layer 116 serving as a negative electrode, whereby lithium is diffused into the niobium oxide layer 110 so that the niobium oxide layer 110 is doped with lithium; consequently, $Li_xNb_2O_5$ (x>0) is formed.

Note that the niobium oxide layer 110 may be doped with all the lithium in the lithium layer 116 by the predoping or part of the lithium layer 116 may be left. The part of the lithium layer 116 left after the predoping can be used to compensate lithium lost by irreversible capacity due to charge and discharge of the power storage element.

Although the insulating layer 102 is provided in this embodiment, a structure without the insulating layer 102 may be employed. For example, in the case where an insulating material is used for the substrate 100, the insulating layer 102 can be omitted.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like; a compound semiconductor substrate made of GaN or the like; a silicon-on-insulator (SOI) substrate; or the like may be used as the substrate 100. Still alternatively, any of these substrates further provided with a semiconductor element such as a transistor may be used as the substrate 100.

Further alternatively, a flexible substrate may be used as the substrate 100. Note that as a method for forming a power storage element over a flexible substrate, there is a method in which after a power storage element is formed over a non-flexible substrate, the power storage element is separated from the non-flexible substrate and transferred to a flexible substrate. In that case, a separation layer is preferably provided between the non-flexible substrate and the power storage element.

The insulating layer 102 may be formed to have a single-layer or layered structure using at least one of the following materials: silicon oxide, silicon oxynitride, silicon nitride oxide, silicon nitride, aluminum oxide, aluminum nitride, hafnium oxide, zirconium oxide, yttrium oxide, gallium oxide, lanthanum oxide, cesium oxide, tantalum oxide, and magnesium oxide.

The vanadium layer 104 and the niobium layer 106 can be formed by a sputtering method, a vacuum deposition method, or the like. When a sputtering method is used, not an RF power supply but a DC power supply is used for deposition because vanadium has high conductivity. A sputtering method using a DC power supply is preferable because the deposition rate is high and thus cycle time is short. The thickness may be, for example, greater than or equal to 100 nm and less than or equal to 10 μm. Alternatively, the vanadium layer 104 and the niobium layer 106 may be formed by nanoimprint lithography.

The vanadium layer or the niobium layer may be formed over a selectively formed current collector layer. For example, a layered structure may be employed in which the vanadium layer or the niobium layer is formed over a current collector selectively formed using titanium, aluminum, copper, or the like. Alternatively, a layered structure including more than two layers may be employed.

The distance between the vanadium layer 104 and the niobium layer 106 may be, for example, greater than or equal to 10 nm and is preferably greater than or equal to 100 nm for ease of manufacture. Such a distance is provided to prevent a short circuit. However, a wide distance between the vanadium layer 104 serving as a positive electrode current collector and the niobium layer 106 serving as a negative electrode current collector decreases the conductivity of carrier ions. Thus, the distance between the vanadium layer 104 and the niobium layer 106 is appropriately adjusted in accordance with the ionic conductivity of a solid electrolyte used in a secondary battery.

Note that either the vanadium layer 104 or the niobium layer 106 may be formed first.

In this embodiment, the vanadium layer is used as the positive electrode current collector layer; however, the present invention is not limited thereto. A layer containing manganese may be used as a positive electrode current collector layer.

Further, in this embodiment, the niobium layer is used as the negative electrode current collector layer; however, the present invention is not limited thereto. A layer containing copper, cobalt, nickel, iron, tungsten, molybdenum, or tantalum may be used as a negative electrode current collector layer.

The vanadium oxide layer 108 can be formed by performing oxidation treatment on a surface of the vanadium layer 104. Similarly, the niobium oxide layer 110 can be formed by performing oxidation treatment on a surface of the niobium layer 106. Note that oxidation treatment for formation of the vanadium oxide layer 108 and oxidation treatment for formation of the niobium oxide layer 110 can be performed at one time. Thus, the vanadium oxide layer 108 and the niobium oxide layer 110 can be formed simultaneously, so that the process can be simplified.

Also in the case of using a positive electrode current collector layer formed using any of the above elements other than vanadium and a negative electrode current collector layer formed using any of the above elements other than niobium, oxidation treatment is performed, whereby layers serving as positive electrode active material layers and negative electrode active material layers can be formed.

The vanadium oxide layer 108 and the niobium oxide layer 110 function as a positive electrode active material and a negative electrode active material, respectively. Thus, the thickness of the vanadium oxide layer 108 and the niobium oxide layer 110 may be adjusted in accordance with necessary battery capacity. Note that complete oxidation of the vanadium layer 104 and the niobium layer 106 results in the loss of the functions of the positive electrode current collector and the negative electrode current collector. Thus, for example, in the case of performing oxidation treatment on the vanadium layer 104 to form the vanadium oxide layer 108, treatment conditions are adjusted so that 10% or more of the vanadium layer 104 which has not been subjected to treatment is left.

For the solid electrolyte layer 112, an inorganic solid electrolyte which can be formed by a sputtering method, an evaporation method, or a chemical vapor deposition method (specifically a metal-organic chemical vapor deposition method) may be used. Examples of the inorganic solid electrolyte are a sulfide-based solid electrolyte and an oxide-based solid electrolyte.

Examples of the sulfide-based solid electrolyte are compounds containing lithium and sulfur such as $Li_2S$—$SiS_2$—$Li_3PO_4$, $Li_2S$—$P_2S_5$, $Li_2S$—$SiS_2$—$Ga_2S_3$, $LiI$—$Li_2S$—$P_2S_5$, $LiI$—$Li_2S$—$B_2S_3$, $LiI$—$Li_2S$—$SiS_2$, $Li_3PO_4$—$Li_2S$—$SiS_2$, and $Li_4SiO_4$—$Li_2S$—$SiS_2$.

Examples of the oxide-based solid electrolyte are compounds containing lithium and sulfur, compounds containing lithium and oxygen, and lithium oxides such as LiPON, $Li_2O$, $Li_2CO_3$, $Li_2MoO_4$, $Li_3PO_4$, $Li_3VO_4$, $Li_4SiO_4$, LLT ($La_{2/3-x}Li_{3x}TiO_3$), and LLZ($Li_7La_3Zr_2O_{12}$).

Alternatively, a polymer solid electrolyte such as poly(ethylene oxide) (PEO) formed by a coating method or the like may be used. Still alternatively, a composite solid electrolyte containing any of the above inorganic solid electrolytes and a polymer solid electrolyte may be used.

The lithium layer 116 may be formed by a sputtering method, a vacuum deposition method, or the like. The thickness of the lithium layer 116 is appropriately determined depending on the amount needed for predoping. Note that the lithium layer 116 is formed so as to overlap with at least one of the vanadium oxide layer 108 and the niobium oxide layer 110 and may be formed over the entire surface over which the lithium layer 116 is to be formed. Although the lithium layer 116 is formed so as to overlap with the niobium oxide layer 110 with the solid electrolyte layer 112 interposed therebetween in FIG. 1C, the lithium layer 116 may be in direct contact with the niobium oxide layer 110.

The sealing layer 114 is also referred to as a capping layer. The sealing layer 114 is formed to cover the solid electrolyte layer 112, the vanadium oxide layer 108, and the niobium oxide layer 110. The sealing layer 114 formed in this manner can prevent the power storage element 200 from being exposed to the air. For the sealing layer 114, an insulating material such as a resin (e.g., epoxy resin), glass, an amorphous compound, or ceramics can be used, for example. Further, a layer containing calcium fluoride or the like may be provided as a water absorption layer in an epoxy resin layer. The sealing layer 114 can be formed by a spin coating method, an ink-jet method, or the like.

(Formation Method of Power Storage Element)

Next, a formation method of the power storage element illustrated in FIG. 1C will be described with reference to FIGS. 2A to 2D.

First, the insulating layer 102 is formed over the substrate 100. The insulating layer 102 can be formed by a sputtering method, a CVD method, an evaporation method, or the like. In this embodiment, silicon oxide is preferably deposited to a thickness of approximately 100 nm.

Then, the vanadium layer 104 is formed over the insulating layer 102. The vanadium layer 104 can be formed by a sputtering method, for example. A sputtering method using a DC power supply is preferably employed for formation of the vanadium layer 104 because vanadium has high conductivity. The thickness of the vanadium layer 104 is greater than or equal to 100 nm and less than or equal to 10 µm, preferably greater than or equal to 1 µm and less than or equal to 3 µm.

Processing is performed so that the vanadium layer 104 has a desired shape to function as the positive electrode current collector, after deposition is performed by a deposition method. Alternatively, for example, the vanadium layer 104 is formed by a sputtering method using a metal mask or the like, whereby the vanadium layer 104 can be provided to have a desired shape without a step such as processing.

Alternatively, the vanadium layer 104 may be formed by nanoimprint lithography. In nanoimprint lithography, first, the surface of a plate-shaped mold formed of a resin or the like is processed to have a desired shape; then, the mold processed to have the desired shape is brought into contact with (stamped on) a board over which a material to be deposited (e.g., a vanadium paste) is evenly applied, in order that the material is selectively transferred to the mold, and the selectively transferred material is brought into contact with a surface over which the material is to be deposited, whereby the material can be selectively deposited.

Still alternatively, a vanadium layer may be processed by photolithography after being formed by a sputtering method. For example, a photoresist is subjected to light exposure to form a mask over the formed vanadium layer and etching is performed using hydrofluoric acid, so that the processed vanadium layer 104 can be formed.

Then, the niobium layer 106 is formed over the insulating layer 102. The niobium layer 106 can be formed by a sputtering method, for example A sputtering method using a DC power supply is preferably employed for formation of the niobium layer 106 because niobium has high conductivity. The thickness of the niobium layer 106 is greater than or equal to 100 nm and less than or equal to 10 µm, preferably greater than or equal to 1 µm and less than or equal to 3 µm.

Processing is performed so that the niobium layer 106 has a desired shape to function as the negative electrode current collector, after deposition is performed by a deposition method. Alternatively, for example, the niobium layer 106 is formed by a sputtering method using a metal mask or the like, whereby the niobium layer 106 can be provided to have a desired shape without a step such as processing.

Alternatively, the niobium layer 106 may be formed by nanoimprint lithography.

Still alternatively, a niobium layer may be processed by photolithography after being formed by a sputtering method. For example, a photoresist is subjected to light exposure to form a mask over the formed niobium layer and etching is performed using an alkaline solution such as a potassium hydroxide aqueous solution, so that the processed niobium layer 106 can be formed.

Through the above steps, the vanadium layer 104 functioning as the positive electrode current collector and the niobium layer 106 functioning as the negative electrode current collector can be formed.

Figure 2A:
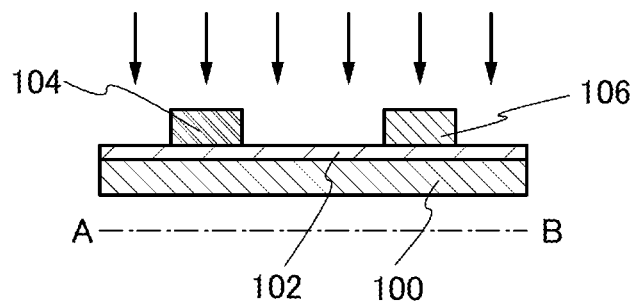
FIGS. 2A to 2D are cross-sectional views which illustrate a formation method of a power storage element of one embodiment of the present invention.

Then, the vanadium layer 104 and the niobium layer 106, which have been formed, are subjected to oxidation treatment such as oxygen plasma treatment, radical oxidation treatment, anodic oxidation treatment, or thermal oxidation treatment (see FIG. 2A).

Figure 2B:
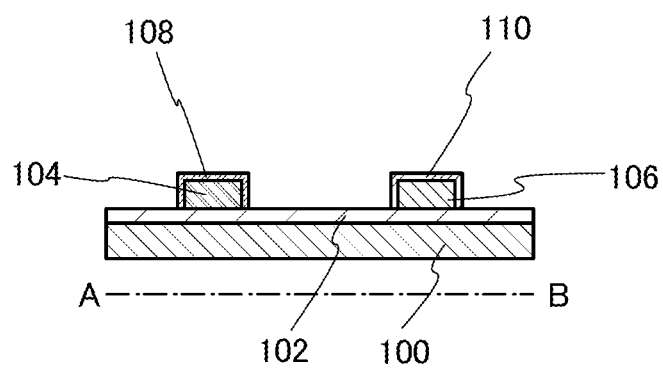

By the oxidation treatment, the surfaces of the vanadium layer 104 and the niobium layer 106 are oxidized, so that the vanadium oxide layer 108 and the niobium oxide layer 110 are formed (see FIG. 2B). Anodic oxidation treatment enables formation of a thick oxide film and thus is suitable for forming the vanadium oxide layer 108 and the niobium oxide layer 110 so that they are thick.

Then, the solid electrolyte layer 112 is formed in contact with the vanadium oxide layer 108 and the niobium oxide layer 110. For the solid electrolyte layer 112, LiPON may be used, for example. LiPON can be deposited by a sputtering method; specifically, a $Li_3PO_4$ target and a reactive sputtering method using a reaction gas containing a nitrogen gas can be used. The thickness of the solid electrolyte layer 112 is greater than or equal to 100 nm and less than or equal to 10 μm. Further, when deposition is performed using a metal mask, the solid electrolyte layer 112 having a desired shape can be formed without a step such as processing.

Alternatively, nanoimprint lithography or photolithography may be employed for forming the solid electrolyte layer 112.

Figure 2C:
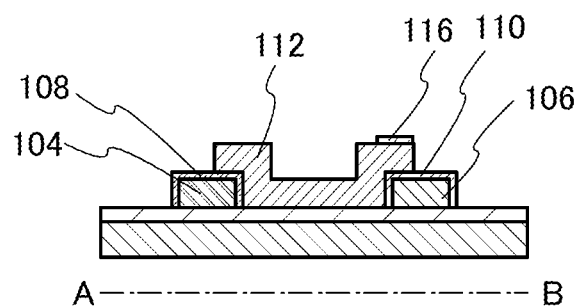

Then, the lithium layer 116 is formed so as to overlap with the niobium oxide layer 110 with the solid electrolyte layer 112 interposed therebetween (see FIG. 2C). The lithium layer 116 may be formed by an evaporation method, a sputtering method, or the like. The thickness of the lithium layer 116 is appropriately determined depending on the amount needed for predoping. Note that the lithium layer 116 is formed so as to overlap with at least one of the vanadium oxide layer 108 and the niobium oxide layer 110 and may be formed over the entire surface over which the lithium layer 116 is to be formed. Although the lithium layer 116 is formed so as to overlap with the niobium oxide layer 110 in FIG. 1C, the lithium layer 116 may be in direct contact with the niobium oxide layer 110. The lithium layer 116 in direct contact with the niobium oxide layer 110 allows the niobium oxide layer 110 to be predoped with lithium without a process such as application of an electric field. Note that the same applies to predoping the vanadium oxide layer 108.

Figure 2D:
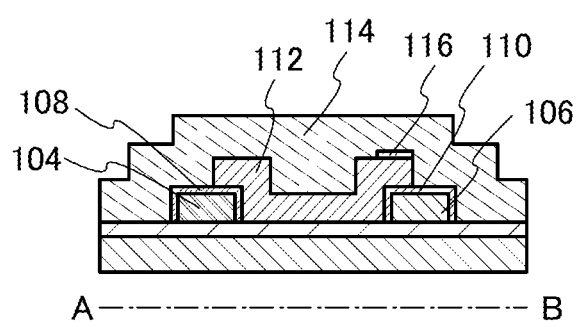

Then, the sealing layer 114 is formed to cover the lithium layer 116, the solid electrolyte layer 112, the vanadium oxide layer 108, and the niobium oxide layer 110 (see FIG. 2D). For the sealing layer 114, an epoxy resin may be used, for example. The sealing layer 114 is provided to prevent the power storage element 200 from being exposed to external air, leading to minimization of deterioration of the power storage element 200.

Through the above steps, the power storage element 200 in FIG. 1C can be formed.

As described in one embodiment of the present invention, oxidation treatment is performed on the positive electrode current collector layer and the negative electrode current collector layer, whereby the positive electrode active material layer and the negative electrode active material layer can be formed on the surface of the positive electrode current collector layer and the surface of the negative electrode current collector layer, respectively. Thus, the manufacturing process can be simplified, leading to a reduction in manufacturing cost.

According to one embodiment of the present invention, a power storage element which includes a positive electrode and a negative electrode provided so as to be level with each other and which can be formed through a simple process and a formation method of the power storage element can be provided.

Embodiment 2

A power storage device in this embodiment is different from the power storage device 900 in Embodiment 1 in that the plurality of power storage elements 200 are electrically connected through wirings. Specifically, in this embodiment, the plurality of power storage elements 201 arranged so as to be level with each other in a power storage device 901 are electrically connected through wirings 218, whereby the power storage elements 201 are arranged in series or in parallel.

In this embodiment, as in Embodiment 1, descriptions will be given of a power storage element and a power storage device in each of which a vanadium layer is used as a positive electrode current collector layer; a vanadium oxide layer is used as a positive electrode active material layer; a niobium layer is used as a negative electrode current collector layer; and a niobium oxide layer is used as a negative electrode active material layer.

In this embodiment, a means for switching between series connection and parallel connection of the power storage elements (also referred to as a switch) may be provided. A semiconductor device including a transistor and the like may be used as the switching means, for example.

Figure 3A:
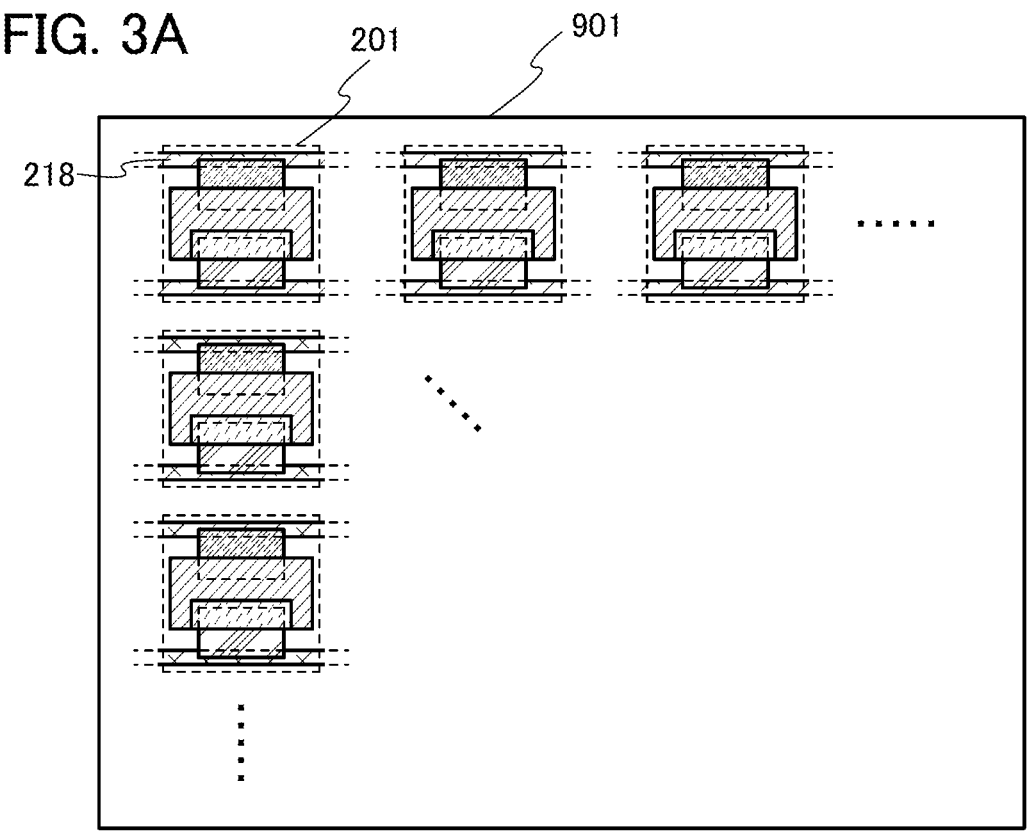
FIGS. 3A to 3C are top views and a cross-sectional view which illustrate a power storage device of one embodiment of the present invention.
Figure 3B:
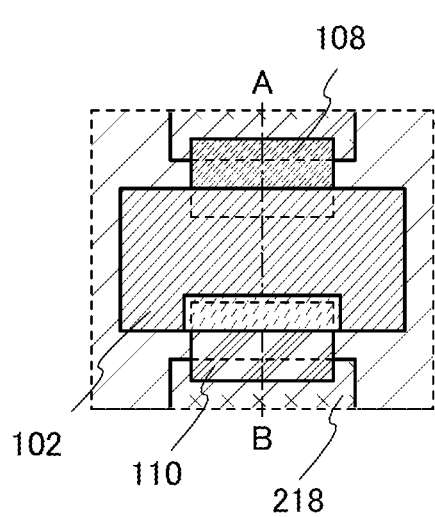
Figure 3C:
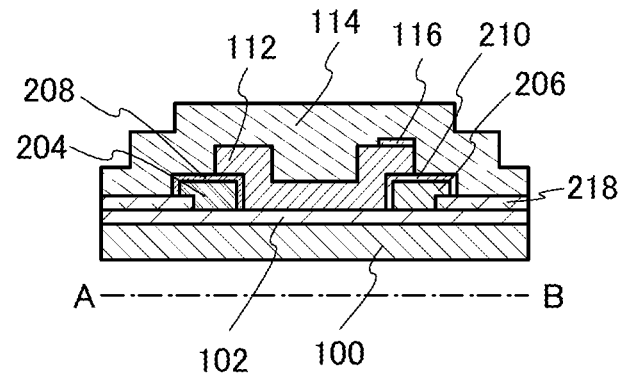

FIG. 3A is a top view of the power storage device 901. As illustrated in FIG. 3A, the plurality of power storage elements 201 are arranged and electrically connected through the wirings 218. Although not particularly illustrated, a switch for electrical connection can be provided between the power storage elements 201. FIG. 3B is a top view of the power storage element 201 and FIG. 3C is a cross-sectional view along dashed dotted line A-B in FIG. 3B. Note that the difference between the power storage element 201 and the power storage element 200 in Embodiment 1 is presence or absence of the wirings 218 connected to the vanadium layer 204 and the niobium layer 206.

The wiring 218 is preferably formed using a material with high conductivity. For the wiring 218, a metal film containing an element selected from gold (Au), platinum (Pt), aluminum (Al), chromium (Cr), copper (Cu), tantalum (Ta), titanium (Ti), molybdenum (Mo), and tungsten (W) or a metal nitride film containing any of the above elements as its component (e.g., a titanium nitride film, a molybdenum nitride film, or a tungsten nitride film) can be used.

The wiring 218 can be formed by a sputtering method, a CVD method, an evaporation method, or the like. Further, a metal mask can be used in formation of the wiring 218 by any of the methods, whereby a desired shape can be formed without processing. Alternatively, nanoimprint lithography may be employed, in which case the wirings 218 each having a desired shape can be formed without a step for processing as in the case of using a metal mask.

As described above, the plurality of power storage elements 201 are electrically connected through the wirings 218 and switches with which connection of the power storage elements 201 is switched are provided. The switch can be formed using a semiconductor device including a transistor and the like. Although the semiconductor device can be provided so as to be level with the power storage element 201, a space for the power storage element 201 is reduced by the semiconductor device. Thus, the semiconductor device and the power storage element 201 are preferably formed in different layers; for example, the power storage element 201 is formed in a layer over the semiconductor device, after the semiconductor device is formed over a substrate.

Next, a manufacturing method of a structure where a semiconductor device (here, a transistor 501) and the power storage element 201 are stacked will be described with reference to FIGS. 4A to 4D and FIGS. 5A to 5D. Note that the transistor 501 described below is only an example and is not limited thereto.

<Formation Method of Transistor 501>

First, the substrate 100 is prepared. There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate of silicon, silicon carbide, or the like, a compound semiconductor substrate of silicon germanium or the like, an SOI (silicon on insulator) substrate, or the like can be used.

Still alternatively, a flexible substrate may be used as the substrate 100. Note that as a method for forming a transistor over a flexible substrate, there is a method in which after a transistor is formed over a non-flexible substrate, the transistor is separated from the non-flexible substrate and transferred to the substrate 100 which is flexible. In that case, a separation layer is preferably provided between the non-flexible substrate and the transistor.

Then, the base insulating film 502 is formed. The base insulating film 502 may be formed to have a single-layer or layered structure using one or more of the following materials: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Next, a semiconductor film to be the semiconductor layer 504 is formed using a Group 14 element such as silicon or germanium, or a metal oxide such as In—Ga—Zn-based oxide. The semiconductor film may be formed by a sputtering method, a CVD method, an MBE method, an ALD method, or a PLD method.

Next, the semiconductor film to be the semiconductor layer 504 is processed into an island shape. For example, etching treatment is performed using a resist mask that is formed by a photolithography method, whereby the semiconductor layer 504 having a desired shape is obtained.

Figure 4A:
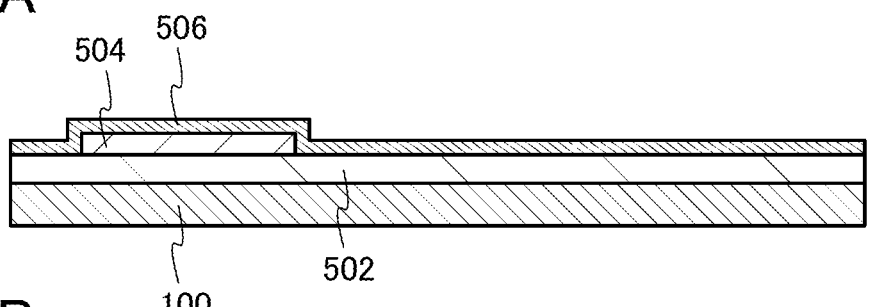
FIGS. 4A to 4D are cross-sectional views which illustrate a formation method of a power storage element of one embodiment of the present invention.

Then, a gate insulating film 506 is formed (see FIG. 4A). The gate insulating film 506 may be formed to have a single-layer or layered structure using one or more of the following materials: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide. The gate insulating film 506 may be formed by a sputtering method, a CVD method, an MBE method, an ALD method, or a PLD method.

Then, a conductive film to be a gate electrode 508 is formed. The conductive film may be formed to have a single-layer or layered structure using a simple substance, a nitride, an oxide, or an alloy containing an element selected from Al, Ti, Cr, Co, Ni, Cu, Y, Zr, Mo, Ag, Ta, and W. The conductive film may be formed by a sputtering method, a CVD method, an MBE method, an ALD method, or a PLD method.

Figure 4B:
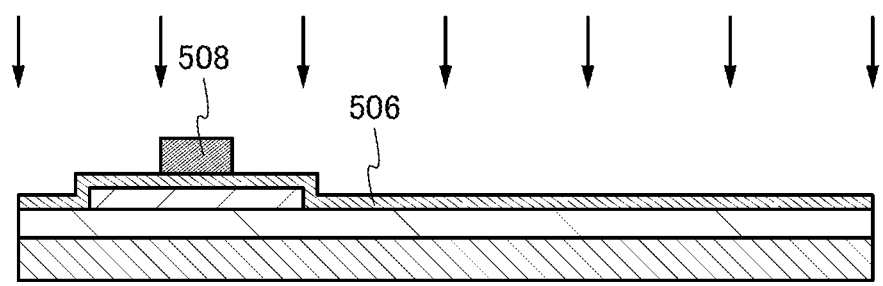

The conductive film is processed to form the gate electrode 508, and an impurity which generates a carrier in the semiconductor layer 504 is added using the gate electrode 508 as a mask (see FIG. 4B).

Figure 4C:
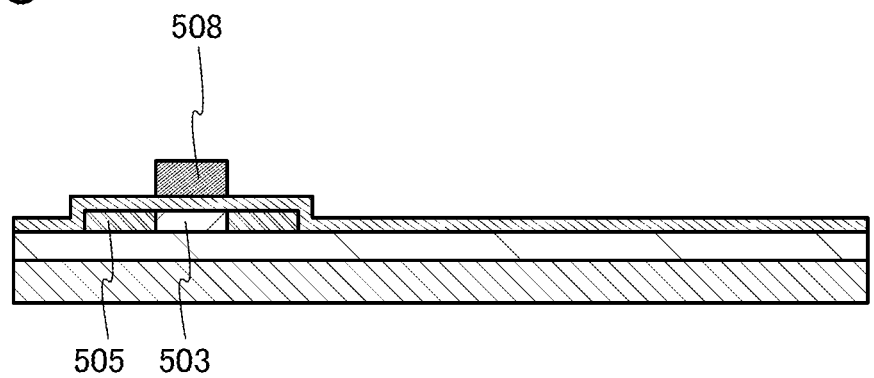
Figure 4D:
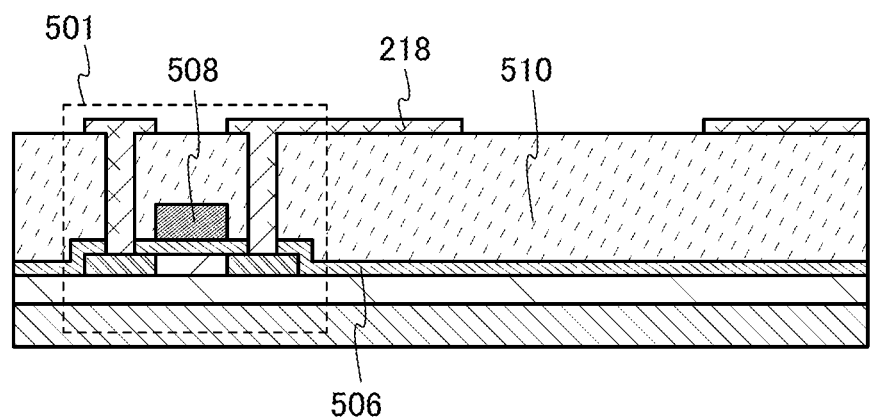

When an impurity is added to the semiconductor layer 504, a channel region 503 to which the impurity is not added and low resistance regions 505 to which the impurity is added are formed (see FIG. 4C). As the impurity, phosphorus, boron, or the like may be added in the case where the semiconductor layer is formed using silicon or a metal oxide such as In—Ga—Zn-based oxide.

Then, an interlayer insulating film 510 is formed. The interlayer insulating film 510 may be formed using a method and a material that are similar to those of the base insulating film 502.

Then, the interlayer insulating film 510 is processed, and the wiring 218 is formed in contact with the semiconductor layer 504. The wiring 218 can be formed by processing a conductive film to be the wiring 218 (see FIG. 4D). Although the structure where the wiring 218 is connected to the semiconductor layer 504 of the transistor 501 is described in this embodiment, the structure of the transistor 501 is not limited thereto. For example, the gate electrode 508 may be connected to the wiring 218.

Through the above steps, the transistor 501 can be formed.

<Formation Method of Power Storage Element 201>

Next, a method for forming the power storage element 201 above the transistor 501 formed through the above steps will be described below.

First, the vanadium layer 204 is formed over the interlayer insulating film 510. The vanadium layer 204 can be formed by a sputtering method, for example. A sputtering method using a DC power supply is preferably employed for formation of the vanadium layer 204 because vanadium has high conductivity. The thickness of the vanadium layer 204 is greater than or equal to 100 nm and less than or equal to 10 μm, or greater than or equal to 1 μm and less than or equal to 3 μm.

The vanadium layer 204 can be prepared by employing materials and methods similar to those employed for the vanadium layer 104 described in Embodiment 1.

Then, the niobium layer 206 is formed over the interlayer insulating film 510. The niobium layer 206 can be formed by a sputtering method, for example. A sputtering method using a DC power supply is preferably employed for formation of the niobium layer 206 because niobium has high conductivity. The thickness of the niobium layer 206 is greater than or equal to 100 nm and less than or equal to 10 µm, or greater than or equal to 1 µm and less than or equal to 3 µm.

The niobium layer 206 can be prepared by employing materials and methods similar to those employed for the niobium layer 106 described in Embodiment 1.

Through the above steps, the vanadium layer 204 serving as the positive electrode current collector and the niobium layer 206 serving as the negative electrode current collector can be formed.

Figure 5A:
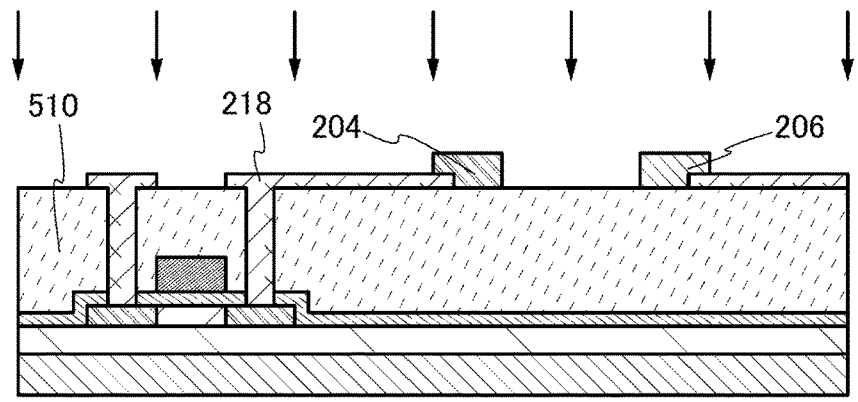
FIG. 5A to 5D are cross-sectional views which illustrate the formation method of a power storage element of one embodiment of the present invention.

Then, the vanadium layer 204 and the niobium layer 206, which have been formed, are subjected to oxidation treatment such as oxygen plasma treatment, radical oxidation treatment, anodic oxidation treatment, or thermal oxidation treatment (see FIG. 5A).

Figure 5B:
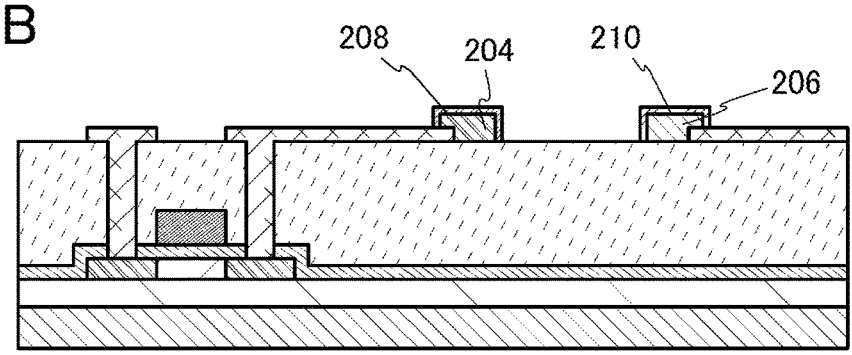

By the oxidation treatment, the surfaces of the vanadium layer 204 and the niobium layer 206 are oxidized, whereby the vanadium oxide layer 208 and the niobium oxide layer 210 are formed (see FIG. 5B).

Then, the solid electrolyte layer 112 is formed in contact with the vanadium oxide layer 208 and the niobium oxide layer 210. The solid electrolyte layer 112 can be prepared by employing a material and a method at a thickness similar to those employed for the solid electrolyte layer 112 described in Embodiment 1.

Figure 5C:
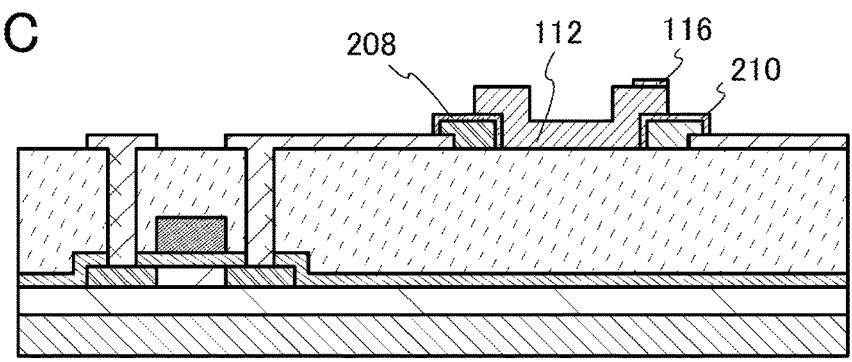

Then, the lithium layer 116 is formed so as to overlap with the niobium oxide layer 210 with the solid electrolyte layer 112 interposed therebetween (see FIG. 5C). The lithium layer 116 can be prepared by employing methods similar to those employed for the lithium layer 116 described in Embodiment 1.

Figure 5D:
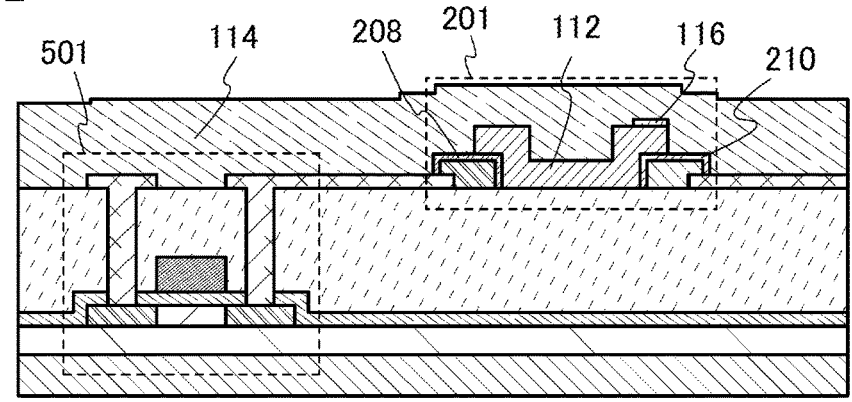

Then, the sealing layer 114 is formed to cover the lithium layer 116, the solid electrolyte layer 112, the vanadium oxide layer 208, and the niobium oxide layer 210 (see FIG. 5D). The sealing layer 114 can be prepared by employing materials and methods similar to those employed for the sealing layer 114 described in Embodiment 1.

Figure 6:
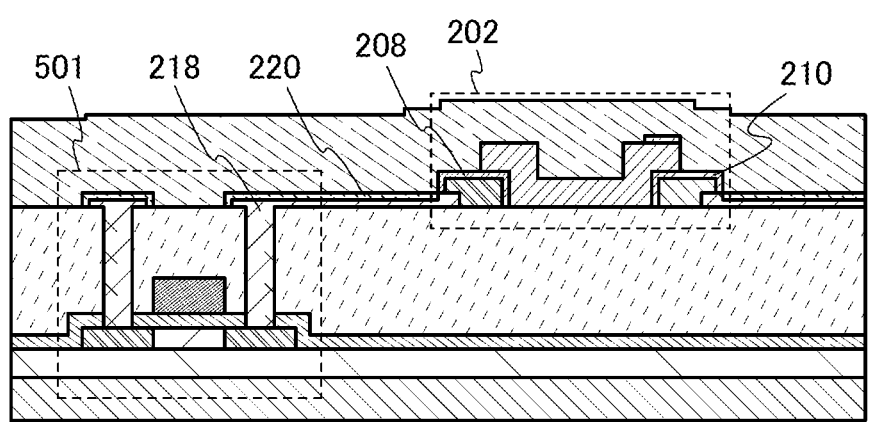
FIG. 6 is a cross-sectional view which illustrates a power storage element of one embodiment of the present invention.

Although the vanadium oxide layer 208 and the niobium oxide layer 210 are formed by performing oxidation treatment on the vanadium layer 204 and the niobium layer 206 in FIG. 5B, a surface of the wiring 218 may also be oxidized by the oxidation treatment. For example, in the case where aluminum or an aluminum alloy is used for the wiring 218, a surface of the aluminum is oxidized by oxidation treatment, so that aluminum oxide in the passive state is formed. The use of a metal oxide film 220 formed on the surface of the wiring 218 in such a manner (see FIG. 6) allows formation of a highly reliable power storage device which has resistance to the deterioration of the wiring due to moisture or the like from external air.

Through the above steps, the power storage element 201 can be formed above the transistor 501.

Figure 7A:
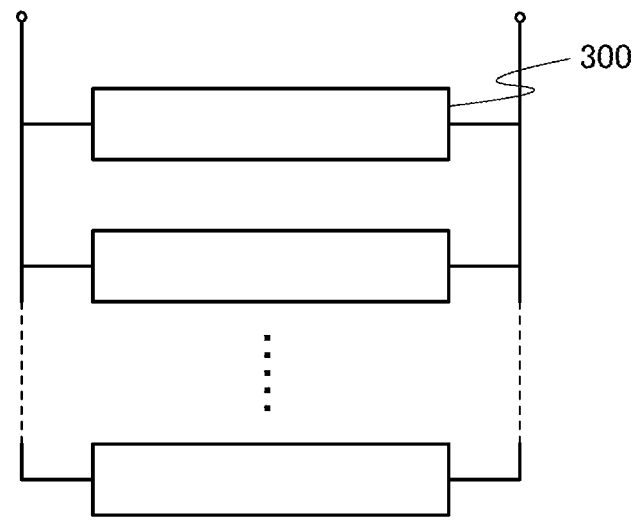
FIGS. 7A and 7B are a block diagram and a circuit diagram which illustrate a power storage device of one embodiment of the present invention.

Next, FIG. 7A is a block diagram illustrating connection in the power storage device 901 where the plurality of power storage elements 201 are electrically connected through the wirings 218 in FIG. 3A. Note that a power storage element array 300 includes the plurality of power storage elements 201.

Figure 7B:
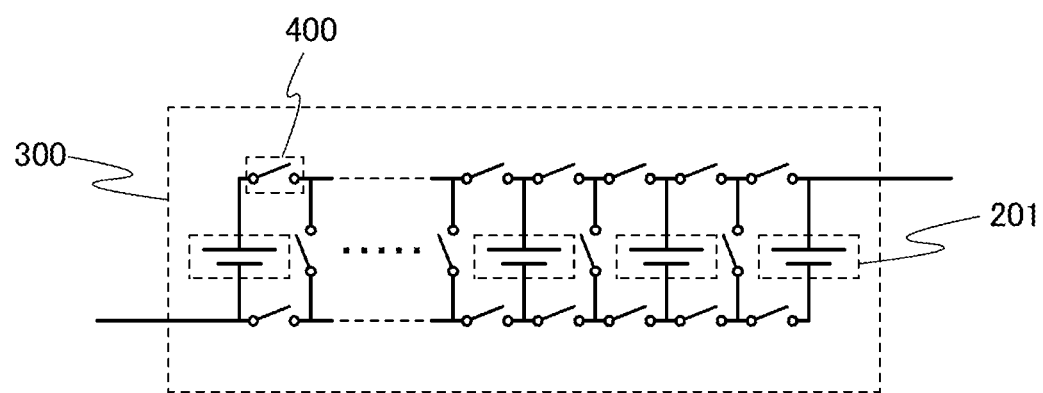

As illustrated in FIG. 7B, in the power storage element array 300, the plurality of power storage elements 201 are connected to each other, and a plurality of switches 400 are provided between the adjacent power storage elements 201.

With the switches 400, the connection of the wirings 218 can be switched, whereby switching between series connection and parallel connection of the power storage elements 201 in the power storage element array 300 can be performed. Additionally, series-parallel connection in which series connection and parallel connection are combined can be employed.

Figure 8A:
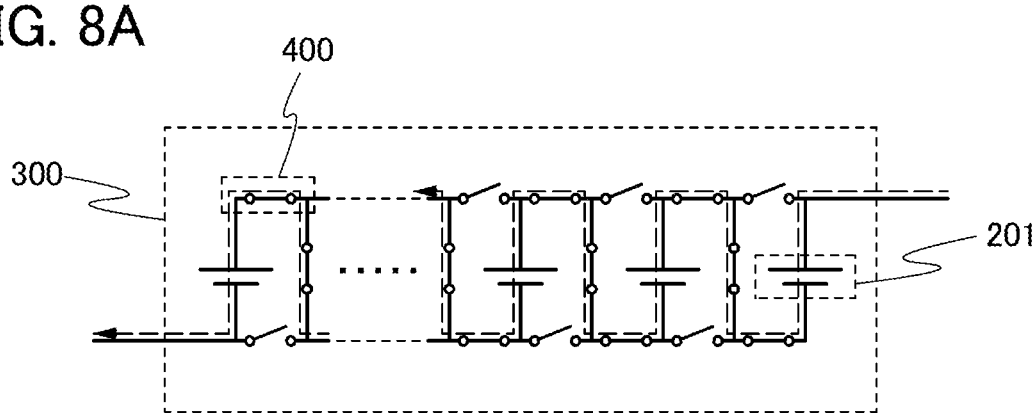
FIGS. 8A and 8B are circuit diagrams which illustrate a power storage element array of one embodiment of the present invention.

For example, by switching the connection of the switches 400 as illustrated in FIG. 8A, the power storage elements 201 are connected in series.

Figure 8B:
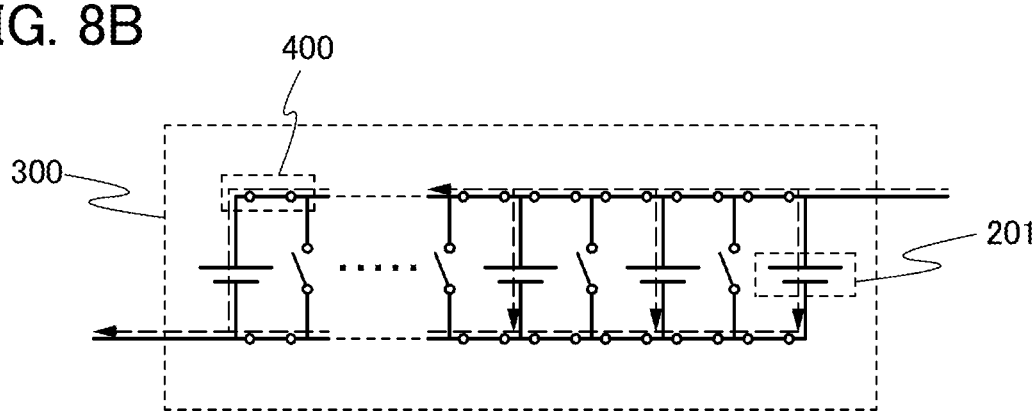

Further, by switching the connection of the switches 400 as illustrated in FIG. 8B, the power storage elements 201 are connected in parallel.

As described above, by switching the connection of the switches 400, switching between series connection and parallel connection of the plurality of power storage elements 201 can be easily performed. Thus, for example, in the case where a high electromotive force is needed, the power storage elements 201 are connected in series, whereby the electromotive force can be increased in accordance with the number of connected elements. When the power storage elements 201 are connected in parallel, the power storage elements 201 can be charged all at once, leading to a reduction in charging time.

According to this embodiment, various potentials according to the number of serially connected power storage elements can be supplied even simultaneously. For example, a circuit including a plurality of elements (e.g., CPU, DRAM, and SRAM), such as LSI, needs to be provided with a plurality of power supply circuits because the plurality of elements need different potentials. In contrast, the power storage device of this embodiment enables various potentials to be supplied simultaneously, so that such a plurality of power supply circuits are unnecessary. Therefore, reductions in scale and cost of a circuit can be achieved.

As described in one embodiment of the present invention, oxidation treatment is performed on the positive electrode current collector layer and the negative electrode current collector layer, whereby the positive electrode active material layer and the negative electrode active material layer can be formed on the surface of the positive electrode current collector layer and the surface of the negative electrode current collector layer, respectively, at the same time. Thus, the manufacturing process can be simplified, leading to a reduction in manufacturing cost.

According to one embodiment of the present invention, a power storage element which includes a positive electrode and a negative electrode provided so as to be level with each other and which can be formed through a simple process, a formation method of the power storage element, and a power storage device can be provided.

Note that circuit diagrams in FIG. 7B and FIGS. 8A and 8B are just examples; a circuit where the arrangement of the power storage elements 201 and the switches 400 is changed as appropriate may be used.

Embodiment 3

In this embodiment, application examples of any of the power storage devices described in Embodiments 1 and 2 will be described with reference to FIG. 9.

Specific examples of electrical devices each utilizing the power storage device of one embodiment of the present invention are as follows: display devices, lighting devices, desktop personal computers and laptop personal computers, image reproduction devices which reproduce still images and moving images stored in recording media such as digital versatile discs (DVDs), mobile phones, portable game machines, portable information terminals, e-book readers, video cameras, digital still cameras, high-frequency heating appliances such as microwave ovens, electric rice cookers, electric washing machines, air-conditioning systems such as air conditioners, electric refrigerators, electric freezers, and electric refrigerator-freezers, freezers for preserving DNA, and dialyzers. In addition, moving objects driven by electric motors using power from power storage devices are also included in the category of electrical devices. Examples of the moving objects include electric vehicles, hybrid vehicles each including both an internal-combustion engine and an electric motor, and motorized bicycles including motor-assisted bicycles.

In the electrical devices, the power storage device of one embodiment of the present invention can be used as a power storage device for supplying enough power for almost the whole power consumption (referred to as a main power supply). Alternatively, in the electrical devices, the power storage device of one embodiment of the present invention can be used as a power storage device to supply power to the electrical devices when supply of power from a main power supply or a commercial power supply is stopped (such a power storage device is referred to as an uninterruptible power supply). Still alternatively, in the electrical devices, the power storage device of one embodiment of the present invention can be used as a power storage device for supplying power to the electrical devices at the same time as the power supply from a main power supply or a commercial power supply (such a power storage device is referred to as an auxiliary power supply).

Figure 9:
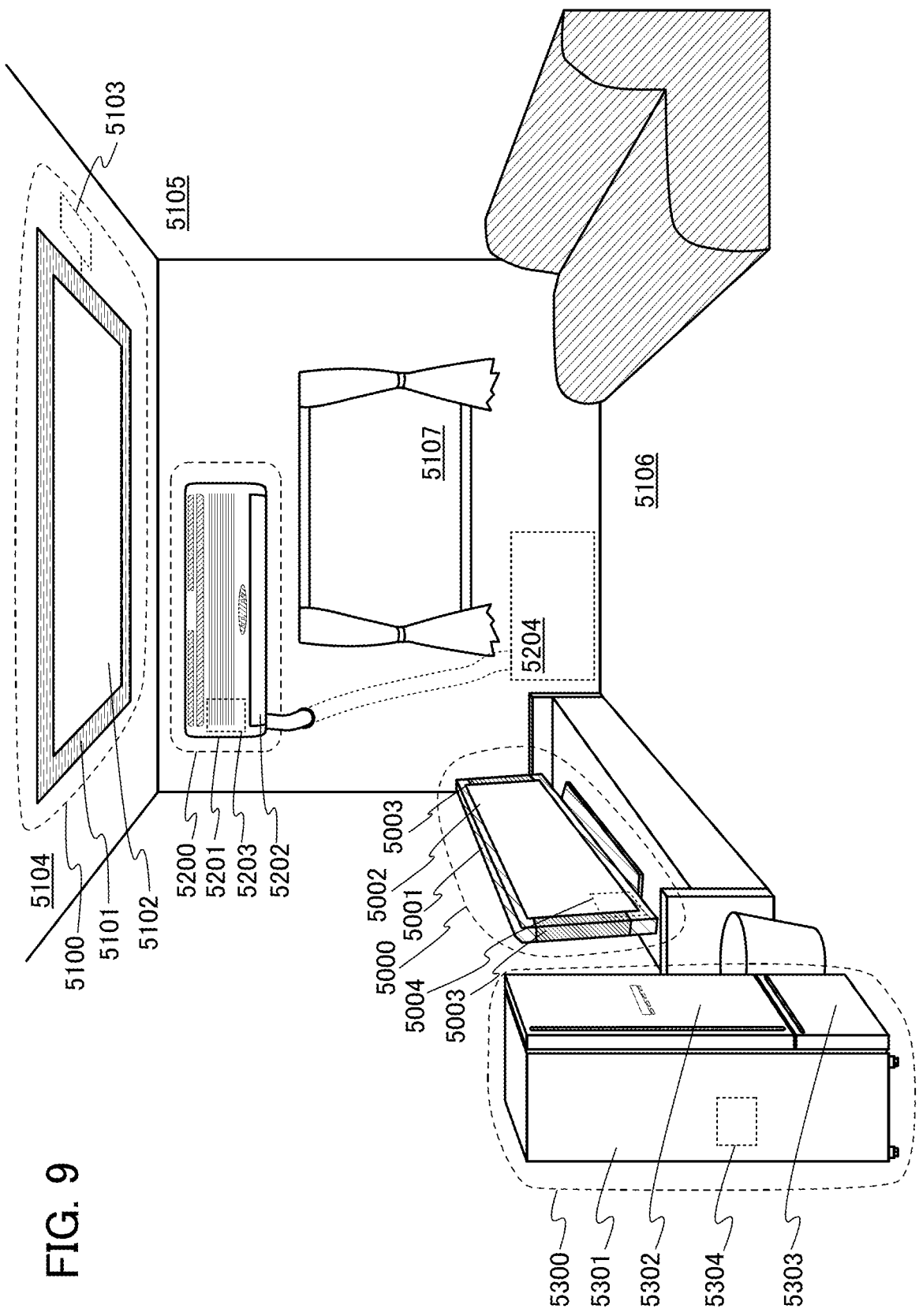
FIG. 9 illustrates electrical devices.

FIG. 9 illustrates specific structures of the electrical devices. In FIG. 9, a display device 5000 is an example of an electrical device including a power storage device 5004 of one embodiment of the present invention. Specifically, the display device 5000 corresponds to a display device for TV broadcast reception and includes a housing 5001, a display portion 5002, speaker portions 5003, and the power storage device 5004. The power storage device 5004 of one embodiment of the present invention is provided in the housing 5001. The display device 5000 can receive power from a commercial power supply. Alternatively, the display device 5000 can use power stored in the power storage device 5004. Thus, the display device 5000 can be operated with the use of the power storage device 5004 of one embodiment of the present invention as an uninterruptible power supply even when power cannot be supplied from a commercial power supply due to power failure or the like.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used for the display portion 5002.

Note that the display device includes, in its category, all of information display devices for personal computers, advertisement displays, and the like besides TV broadcast reception.

In FIG. 9, an installation lighting device 5100 is an example of an electrical appliance including a power storage device 5103 of one embodiment of the present invention. Specifically, the lighting device 5100 includes a housing 5101, a light source 5102, and a power storage device 5103. Although FIG. 9 illustrates the case where the power storage device 5103 is provided in a ceiling 5104 on which the housing 5101 and the light source 5102 are installed, the power storage device 5103 may be provided in the housing 5101. The lighting device 5100 can receive power from a commercial power supply. Alternatively, the lighting device 5100 can use power stored in the power storage device 5103. Thus, the lighting device 5100 can be operated with the use of the power storage device 5103 of one embodiment of the present invention as an uninterruptible power supply even when power cannot be supplied from a commercial power supply due to power failure or the like.

Note that although the installation lighting device 5100 provided in the ceiling 5104 is illustrated in FIG. 9 as an example, the power storage device of one embodiment of the present invention can be used in an installation lighting device provided in, for example, a wall 5105, a floor 5106, a window 5107, or the like other than the ceiling 5104. Alternatively, the power storage device can be used in a tabletop lighting device or the like.

As the light source 5102, an artificial light source which emits light artificially by using power can be used. Specifically, an incandescent lamp, a discharge lamp such as a fluorescent lamp, and light-emitting elements such as an LED and an organic EL element are given as examples of the artificial light source.

In FIG. 9, an air conditioner including an indoor unit 5200 and an outdoor unit 5204 is an example of an electrical appliance including a power storage device 5203 of one embodiment of the invention. Specifically, the indoor unit 5200 includes a housing 5201, an air outlet 5202, and a power storage device 5203. Although FIG. 9 illustrates the case where the power storage device 5203 is provided in the indoor unit 5200, the power storage device 5203 may be provided in the outdoor unit 5204. Alternatively, the power storage devices 5203 may be provided in both the indoor unit 5200 and the outdoor unit 5204. The air conditioner can receive power from a commercial power supply. Alternatively, the air conditioner can use power stored in the power storage device 5203. Particularly in the case where the power storage devices 5203 are provided in both the indoor unit 5200 and the outdoor unit 5204, the air conditioner can be operated with the use of the power storage device 5203 of one embodiment of the present invention as an uninterruptible power supply even when power cannot be supplied from a commercial power supply due to power failure or the like.

Note that although the split-type air conditioner including the indoor unit and the outdoor unit is illustrated in FIG. 9 as an example, the power storage device of one embodiment of the present invention can be used in an air conditioner in which the functions of an indoor unit and an outdoor unit are integrated in one housing.

In FIG. 9, an electric refrigerator-freezer 5300 is an example of an electrical appliance including a power storage device 5304 of one embodiment of the present invention. Specifically, the electric refrigerator-freezer 5300 includes a housing 5301, a door for a refrigerator 5302, a door for a freezer 5303, and the power storage device 5304. The power storage device 5304 is provided in the housing 5301 in FIG. 9. The electric refrigerator-freezer 5300 can receive power from a commercial power supply. Alternatively, the electric refrigerator-freezer 5300 can use power stored in the power storage device 5304. Thus, the electric refrigerator-freezer 5300 can be operated with the use of the power storage device 5304 of one embodiment of the present invention as an uninterruptible power supply even when power cannot be supplied from a commercial power supply due to power failure or the like.

Note that among the electrical devices described above, a high-frequency heating apparatus such as a microwave oven and an electrical device such as an electric rice cooker require high power in a short time. The tripping of a breaker of a commercial power supply in use of an electrical appliance can be prevented by using the power storage device of one embodiment of the present invention as an auxiliary power supply for supplying power which cannot be supplied enough by a commercial power supply.

In addition, in a time period when electrical devices are not used, particularly when the proportion of the amount of power which is actually used to the total amount of power which can be supplied from a commercial power supply source (such a proportion referred to as a usage rate of power) is low, power can be stored in the power storage device, whereby the usage rate of power can be reduced in a time period when the electrical devices are used. For example, in the case of the electric refrigerator-freezer 5300, power can be stored in the power storage device 5304 in night time when the temperature is low and the door for a refrigerator 5302 and the door for a freezer 5303 are not often opened or closed. On the other hand, in daytime when the temperature is high and the door for a refrigerator 5302 and the door for a freezer 5303 are frequently opened and closed, the power storage device 5304 is used as an auxiliary power supply; thus, the usage rate of power in daytime can be reduced.

Next, a portable information terminal which is an example of electrical devices will be described with reference to FIGS. 10A to 10C.

Figure 10A:
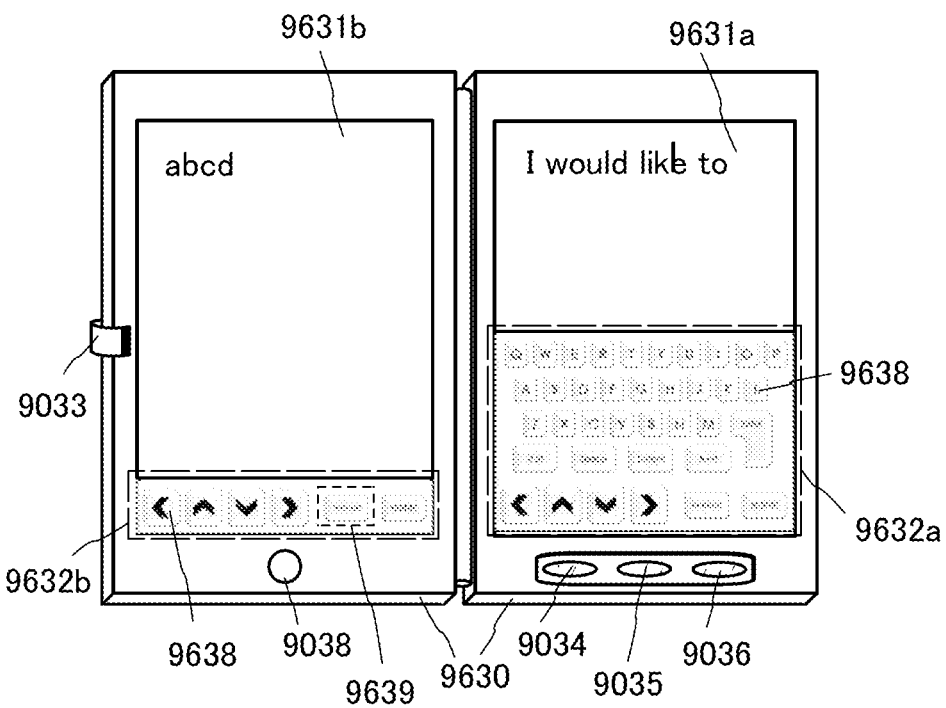
FIG. 10A to 10C illustrate an electrical device.
Figure 10B:
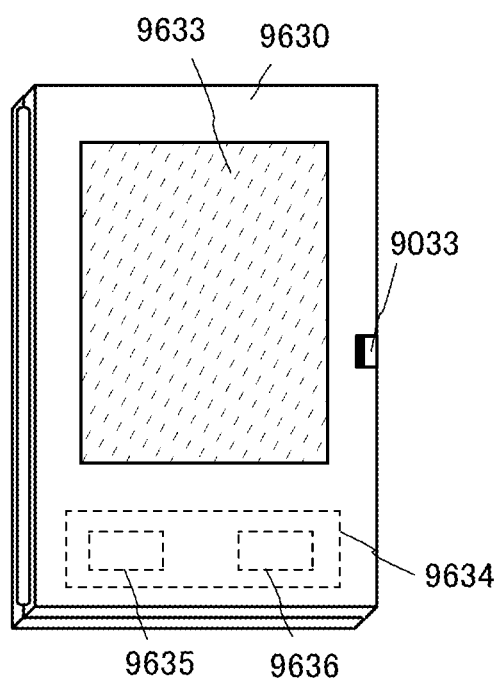

FIGS. 10A and 10B illustrate a tablet terminal which can be folded. FIG. 10A illustrates the tablet terminal in the state of being unfolded. The tablet terminal includes a housing 9630, a display portion 9631*a*, a display portion 9631*b*, a display-mode switching button 9034, a power button 9035, a power-saving-mode switching button 9036, a fastener 9033, and an operation button 9038.

A touch panel area 9632*a* can be provided in part of the display portion 9631*a*, in which area, data can be input by touching displayed operation keys 9638. Note that half of the display portion 9631*a* has only a display function and the other half has a touch panel function. However, the structure of the display portion 9631*a* is not limited to this, and all the area of the display portion 9631*a* may have a touch panel function. For example, a keyboard can be displayed on the whole display portion 9631*a* to be used as a touch panel, and the display portion 9631*b* can be used as a display screen.

A touch panel area 9632*b* can be provided in part of the display portion 9631*b* like in the display portion 9631*a*. When a keyboard display switching button 9639 displayed on the touch panel is touched with a finger, a stylus, or the like, a keyboard can be displayed on the display portion 9631*b*.

The touch panel area 9632*a* and the touch panel area 9632*b* can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, other detecting devices such as sensors for determining inclination, such as a gyroscope or an acceleration sensor, may be incorporated in the tablet terminal Although the display area of the display portion 9631*a* is the same as that of the display portion 9631*b* in FIG. 10A, one embodiment of the present invention is not particularly limited thereto. The display area of the display portion 9631*a* may be different from that of the display portion 9631*b*, and further, the display quality of the display portion 9631*a* may be different from that of the display portion 9631*b*. For example, one of the display portions 9631*a* and 9631*b* may display higher definition images than the other.

FIG. 10B illustrates the tablet terminal in the state of being closed. The tablet terminal includes the housing 9630, a solar cell 9633, a charge/discharge control circuit 9634, a battery 9635, and a DC-DC converter 9636. FIG. 10B illustrates an example where the charge/discharge control circuit 9634 includes the battery 9635 and the DC-DC converter 9636. The power storage device described in the above embodiment is used as the battery 9635.

Since the tablet terminal can be folded, the housing 9630 can be closed when the tablet terminal is not in use. Thus, the display portions 9631*a* and 9631*b* can be protected, which permits the tablet terminal to have high durability and improved reliability for long-term use.

The tablet terminal illustrated in FIGS. 10A and 10B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on a surface of the tablet terminal, can supply electric power to a touch panel, a display portion, an image signal processor, and the like. Note that the solar cell 9633 can be provided on one or both surfaces of the housing 9630 and thus the battery 9635 can be charged efficiently. The use of the power storage device of one embodiment of the present invention as the battery 9635 has advantages such as a reduction in size.

The structure and operation of the charge/discharge control circuit 9634 illustrated in FIG. 10B will be described with reference to a block diagram of FIG. 10C. FIG. 10C illustrates the solar cell 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge and discharge control circuit 9634 in FIG. 10B.

First, an example of operation in the case where electric power is generated by the solar cell 9633 using external light will be described. The voltage of electric power generated by the solar cell 9633 is raised or lowered by the DC-DC converter 9636 so that the electric power has a voltage for charging the battery 9635. When the display portion 9631 is operated with the electric power from the solar cell 9633, the switch SW1 is turned on and the voltage of the electric power is raised or lowered by the converter 9637 to a voltage needed for operating the display portion 9631. In addition, when display on the display portion 9631 is not performed, the switch SW1 is turned off and the switch SW2 is turned on so that the battery 9635 may be charged.

Although the solar cell 9633 is described as an example of a power generation means, there is no particular limitation on the power generation means, and the battery 9635 may be charged with any of the other means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

Figure 10C:
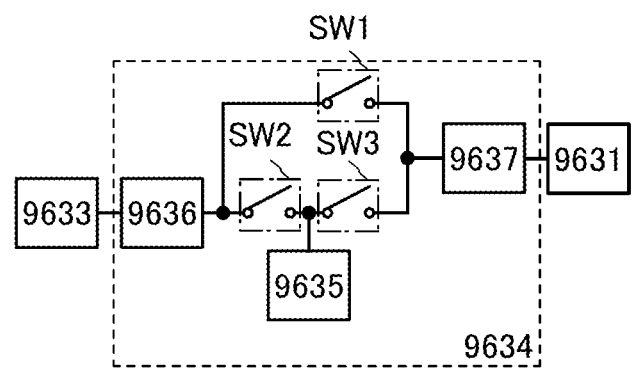

It is needless to say that one embodiment of the present invention is not limited to the electrical device illustrated in FIGS. 10A to 10C as long as the electrical device is equipped with the power storage device described in the above embodiment.

This embodiment can be implemented in combination with any of the above embodiments as appropriate.

This application is based on Japanese Patent Application serial no. 2012-069536 filed with the Japan Patent Office on Mar. 26, 2012, the entire contents of which are hereby incorporated by reference.

What is claimed is:

1. A power storage device comprising:
a power storage element array, the power storage element array comprising:
a plurality of power storage elements connected to each other;
a plurality of wirings; and
a plurality of switches,
wherein each of the plurality of power storage elements comprises a solid electrolyte layer, and
wherein the plurality of switches is configured to series connect, parallel connect, or series-parallel connect the plurality of power storage elements.

2. The power storage device according to claim 1,
wherein the plurality of power storage elements are connected to each other via the plurality of wirings, and
wherein a first power storage element of the plurality of power storage elements is electrically connected to a second power storage element of the plurality of power storage elements adjacent to the first power storage element via 2 and/or 3 switches.

3. The power storage device according to claim 2, wherein the first power storage element is electrically connected to the second power storage element via 3 switches, when the plurality of power storage elements are connected in series, and via 2 switches when the plurality of power storage elements are connected in parallel.

4. The power storage device according to claim 1,
wherein the solid electrolyte layer is in contact with a pair of electrodes, and
wherein a carrier supply layer is spaced apart from the pair of electrodes with the solid electrolyte layer provided therebetween.

5. The power storage device according to claim 4,
wherein the solid electrolyte layer partly covers the pair of conductive layers,
wherein the pair of electrodes each comprises a first layer containing a metal element and a second layer containing an oxide of the metal element, and
wherein a surface of the first layer is covered with the second layer.

6. The power storage device according to claim 5,
wherein in one of the pair of electrodes, the metal element is V or Mn,
wherein in the other of the pair of electrodes, the metal element is Nb, Cu, Co, Ni, Fe, W, Mo or Ta, and
wherein the carrier supply layer contains lithium.

7. A power storage device comprising:
a plurality of power storage element arrays, each of the power storage element arrays comprising:
a plurality of power storage elements connected to each other;
a plurality of wirings; and
a plurality of switches,
wherein the plurality of switches is provided between adjacent power storage elements of the plurality of power storage elements,
wherein each of the plurality of power storage elements comprises a solid electrolyte layer, and
wherein a series connection of the plurality of power storage elements and a parallel connection of the plurality of power storage elements can be changed by switching a connection of the plurality of switches.

8. The power storage device according to claim 7,
wherein the plurality of power storage elements are connected to each other via the plurality of wirings, and
wherein a first power storage element of the plurality of power storage elements is electrically connected to a second power storage element of the plurality of power storage elements adjacent to the first power storage element via 2 and/or 3 switches.

9. The power storage device according to claim 8, wherein the first power storage element is electrically connected to the second power storage element via 3 switches, when the plurality of power storage elements are connected in series, and via 2 switches when the plurality of power storage elements are connected in parallel.

10. The power storage device according to claim 7,
wherein the solid electrolyte layer is in contact with a pair of electrodes, and
wherein a carrier supply layer is spaced apart from the pair of electrodes with the solid electrolyte layer provided therebetween.

11. The power storage device according to claim 10,
wherein the solid electrolyte layer partly covers the pair of conductive layers,
wherein the pair of electrodes each comprises a first layer containing a metal element and a second layer containing an oxide of the metal element, and
wherein a surface of the first layer is covered with the second layer.

12. The power storage device according to claim 11,
wherein in one of the pair of electrodes, the metal element is V or Mn,
wherein in the other of the pair of electrodes, the metal element is Nb, Cu, Co, Ni, Fe, W, Mo or Ta, and
wherein the carrier supply layer contains lithium.

13. A power storage device comprising:
a plurality of power storage element arrays electrically connected to each other, each of the power storage element arrays comprising:
a plurality of power storage elements connected to each other;
a plurality of wirings; and
a plurality of switches,
wherein the plurality of switches is provided between adjacent power storage elements of the plurality of power storage elements,
wherein each of the plurality of power storage elements comprises a solid electrolyte layer, and
wherein the plurality of switches is configured to series connect, and/or parallel connect, and/or series-parallel connect the plurality of power storage elements.

14. The power storage device according to claim 13,
wherein the plurality of power storage elements are connected to each other via the plurality of wirings, and
wherein a first power storage element of the plurality of power storage elements is electrically connected to a second power storage element of the plurality of power storage elements adjacent to the first power storage element via 2 and/or 3 switches.

15. The power storage device according to claim 14, wherein the first power storage element is electrically connected to the second power storage element via 3 switches, when the plurality of power storage elements are connected in series, and via 2 switches when the plurality of power storage elements are connected in parallel.

16. The power storage device according to claim 13,
wherein the solid electrolyte layer is in contact with a pair of electrodes, and
wherein a carrier supply layer is spaced apart from the pair of electrodes with the solid electrolyte layer provided therebetween.

17. The power storage device according to claim 16,
wherein the solid electrolyte layer partly covers the pair of conductive layers,
wherein the pair of electrodes each comprises a first layer containing a metal element and a second layer containing an oxide of the metal element, and
wherein a surface of the first layer is covered with the second layer.

18. The power storage device according to claim 17,
wherein in one of the pair of electrodes, the metal element is V or Mn,
wherein in the other of the pair of electrodes, the metal element is Nb, Cu, Co, Ni, Fe, W, Mo or Ta, and
wherein the carrier supply layer contains lithium.

* * * * *